(12) United States Patent  
Maruska et al.

(10) Patent No.: US 6,284,395 B1  
(45) Date of Patent: Sep. 4, 2001

(54) NITRIDE BASED SEMICONDUCTORS AND DEVICES

(75) Inventors: H. Paul Maruska, Winter Springs, FL (US); Long De Zhu, Woburn; Peter E. Norris, Cambridge, both of MA (US)

(73) Assignee: Corning Applied Technologies Corp., Woburn, MA (US)

( * ) Notice: Subject to any disclaimer, the term of this patent is extended or adjusted under 35 U.S.C. 154(b) by 0 days.

(21) Appl. No.: 09/295,423

(22) Filed: Apr. 20, 1999

Related U.S. Application Data

(63) Continuation of application No. PCT/US97/13762, filed on Aug. 20, 1997, and a continuation-in-part of application No. 08/810,891, filed on Mar. 5, 1997, now abandoned
(60) Provisional application No. 60/012,693, filed on Mar. 6, 1996.

(51) Int. Cl.$^7$ .................................................. H01L 33/00
(52) U.S. Cl. ............................ 428/698; 257/78; 257/103; 257/109; 428/697; 428/699
(58) Field of Search ..................... 428/697, 698, 428/699; 257/78, 103, 109

(56) References Cited

U.S. PATENT DOCUMENTS

| | | | |
|---|---|---|---|
| 3,687,743 | 8/1972 | Le Duc | 148/71 |
| 4,144,116 | 3/1979 | Jacob et al. | 156/611 |
| 4,167,461 | 9/1979 | Dickson et al. | 204/102 |

(List continued on next page.)

OTHER PUBLICATIONS

Eckerlin, "Die Kristallstruktur von BeSiN2," (with English abstract), Z. anorg. allg. Chemie., bd. 353, Heft 5–6, s. 225–236 (1967) No month.

David et al., "Structure de MgSiN2 et MgGeN2," (with English abstract), Bull. Soc. fr. Mineral. Cristallogr., vol. 93, pp. 153–159 (1970) No month.

Maunaye et al., "Preparation et Proprietes de ZnGeN2," (with English abstract), Mat. Res. Bull., vol. 5, pp. 793–796 (1970) No month.

Maunaye et al., "Etude structurale de ZnGeN2," (with English abstract), Bull. Soc. Fr. Miner. Cristallogr., vol. 94, pp. 3–7 (1971) No month.

Maunaye et al., "Structure de MnSiN2 et MnGeN2," Bull. Soc. fr. Miner. Cristallogr., vol. 94, pp. 561–564 (1971) No month.

(List continued on next page.)

Primary Examiner—Archene Turner
(74) Attorney, Agent, or Firm—Hamilton, Brook, Smith & Reynolds, P.C.

(57) ABSTRACT

A single crystal thin film of the compound $ZnSi_xGe_{1-x}N_2$ (where x can range from 0 to 1). This thin film single crystal can be disposed on a single crystal substrate made of, for example, sapphire, silicon carbide, lithium gallate or silicon with or without an additional GaN buffer layer grown on them. Alternately, a GaN single crystal thin film grown on any substrate can be used. In the case of sapphire, it can be R-plane so that the thin film has its c-axis lying within the thin film or A- or C-plane so that the thin film has its c-axis perpendicular to the substrate. The substrate could also be any substrate with a GaN single crystal thin film deposited on it. $ZnSi_xGe_{1-x}N_2$ single crystal thin films can be made by the MOCVD method using suitable precursors, molar injection ratios, and substrate temperatures. It is possible to make various optical, electro-optical or electronic devices with the material, for example, a second harmonic generator emitting blue light.

44 Claims, 2 Drawing Sheets

U.S. PATENT DOCUMENTS

| | | | |
|---|---|---|---|
| 4,268,842 | 5/1981 | Jacob et al. | 357/17 |
| 4,430,188 | 2/1984 | Cohn | 204/290 |
| 4,476,620 | 10/1984 | Ohki et al. | 29/569 L |
| 4,608,481 | 8/1986 | Bagratishvilli et al. | 357/17 |
| 4,695,432 | 9/1987 | Colin et al. | 422/98 |
| 4,857,971 | 8/1989 | Burnham | 357/4 |
| 4,868,633 * | 9/1989 | Plumton et al. | 357/67 |
| 4,911,102 | 3/1990 | Manabe et al. | 118/719 |
| 4,983,360 | 1/1991 | Medrignac et al. | 422/90 |
| 4,992,837 | 2/1991 | Sakai et al. | 357/17 |
| 5,122,845 | 6/1992 | Manabe et al. | 357/17 |
| 5,210,051 | 5/1993 | Carter, Jr. | 437/107 |
| 5,218,216 | 6/1993 | Manabe et al. | 257/103 |
| 5,247,533 | 9/1993 | Okazaki et al. | 372/45 |
| 5,272,108 | 12/1993 | Kozawa | 437/127 |
| 5,278,433 | 1/1994 | Manabe et al. | 257/103 |
| 5,281,830 | 1/1994 | Kotaki et al. | 257/86 |
| 5,290,393 | 3/1994 | Nakamura | 156/613 |
| 5,321,713 | 6/1994 | Kahn et al. | 372/45 |
| 5,334,277 | 8/1994 | Nakamura | 117/102 |
| 5,369,289 | 11/1994 | Tamaki et al. | 257/99 |
| 5,385,862 | 1/1995 | Moustakis | 437/107 |
| 5,387,804 | 2/1995 | Suzuki et al. | 257/77 |
| 5,389,571 | 2/1995 | Takeuchi et al. | 437/133 |
| 5,393,993 | 2/1995 | Edmond et al. | 257/77 |
| 5,408,120 | 4/1995 | Manabe et al. | 257/431 |
| 5,433,169 | 7/1995 | Nakamura | 117/102 |
| 5,468,678 | 11/1995 | Nakamura et al. | 437/107 |
| 5,506,426 | 4/1996 | Kohiki et al. | 257/188 |
| 5,523,589 | 6/1996 | Edmond et al. | 257/77 |
| 5,530,267 | 6/1996 | Brandle, Jr. et al. | 257/76 |
| 5,563,422 | 10/1996 | Nakamura et al. | 257/13 |
| 5,578,839 | 11/1996 | Nakamura et al. | 257/96 |
| 5,583,879 | 12/1996 | Yamazaki et al. | 372/45 |
| 5,585,648 | 12/1996 | Tischler | 257/77 |
| 5,587,593 | 12/1996 | Koide et al. | 257/94 |
| 5,592,501 | 1/1997 | Edmond et al. | 372/45 |
| 5,611,856 | 3/1997 | Schunemann et al. | 117/37 |
| 5,629,054 | 5/1997 | Kanai | 427/575 |

OTHER PUBLICATIONS

Marchand et al., "Sur la preparation d'un nitrure double de silicium et manganese," C. R. Acad. Sc. Paris, t. 272, ser. C, pp. 1654–1656 (1971) No month.

Wintenberger, et al., "Etude Cristallographique et Magnetique de MnGeN2 par Diffraction Neutronique," (with English abstract at the end), Solid State Communications (GB), vol. 11, pp. 1485–1488 (1972) No month.

Maunaye et al., "Les nitrures doubles MnSiN2–MnGeN2," (with English abstract), Revue de Chimie minerale, t. 10, pp. 555–563 (1973) No month.

Wintenberger, "Groupe Spatial et Ordre des Atomes de Zinc et de Germanium dans ZnGeN2," (with English abstract), Mat. Res. Bull., vol. 8, pp. 1049–1054 (1973) No month.

Larson et al. "Synthesis and Properties of ZnGeN2," J. Electrochem. Soc., vol. 121, pp. 1673–1674 (1974) No month.

Grekov et al., "Structure and Chemical Bonding in Ternary Nitrides of the Type A(II)B(IV)N2," Inorganic Materials, vol. 15, No. 11, pp. 1546–1550 (1980) (Translated from the Russian) No month.

Endo et al., "High–pressure synthesis of new compounds, ZnSiN2 and ZnGeN2 with distorted wurtzite structure," J. Mat. Sci. Lett., vol. 11, pp. 424–426 (1992) No month.

* cited by examiner

NITRIDE BASED SEMICONDUCTORS AND DEVICES

CROSS-REFERENCE TO RELATED APPLICATIONS

This application is a continuation of PCT application no.: PCT/US97/13762, filed in the US/RO on Aug. 20, 1997, and a continuation-in-part of U.S. non-provisional application Ser. No. 08/810,891, filed Mar. 5, 1997 abandoned, that claimed priority from a U.S. provisional application No. 60/012,693, filed Mar. 6, 1996, all of which are incorporated herein by reference.

STATEMENT REGARDING INVENTIONS MADE WITH FEDERAL ASSISTANCE

This invention was made with Government support under contract no.: F49620-95-C-0061 awarded by the Department of the Air Force. The Government has certain rights in this invention.

BACKGROUND

1. Technical Field

The invention relates to single crystal thin film ternary nitride semiconductors and devices made from them.

2. Background

In addition to the semiconductors, C, Ge, Si and $\alpha$Sn selected from Group IV of the Periodic Table, a number of useful ones have been produced using binary, ternary, and multinary compounds of other Group elements. The Handbook of Chemistry and Physics, 77th ed, pp 12:90–100, (1996–1997), David R. Lide, ed., CRC Press, New York, London, Tokyo lists various properties of about 200 semiconductors not including alloys. Most of these are not yet as useful as silicon for making electronic devices but have found use in making various optical and electro-optical devices.

The Group III-V compound, GaN, is in important example of a binary semiconductor and in many respects related to the subject of this invention. Thus, a discussion of its growth and use may be instructive background. Unlike with silicon which can be grown as bulk crystals and cut into wafers for further processing, it is often desirable to produce devices from other semiconductors as thin (less than about 20 $\mu$m) films. The metalorganic chemical vapor deposition (MOCVD) method has been used to grow a wide variety of thin film compounds and, since about 1970, has been used to grow GaN. For a slightly out of date but thorough discussion, see Organometallic Vapor Phase Epitaxy, (1989), Gerald B. Stringfellow, Academic press, New York.

In the MOCVD method, metal organic precursors, e.g., triethylgallium and ammonia (NH3) are injected into a reaction chamber containing a heated substrate, e.g., single crystal sapphire ($Al_2O_3$). It has been found that by using suitable substrates, growth of single crystal films will be promoted. Moreover, additional films of different composition can be grown on an underlying film. This method works best when the size of the two crystal lattices are matched. Because the sapphire lattice is 49% bigger than the GaN lattice, growth of high quality single crystal GaN on sapphire is difficult. Unfortunately, for reasons of cost, ruggedness, high melting point and, sometimes, transparency and electrical insulation, sapphire is a highly desirable substrate. Thus methods of growing GaN have resorted to first growing a thin (ca. 20 nm) buffer layer on which additional films are grown. However, such an approach is usually not possible when growing an active layer on another active layer, because the buffer layer could interfere with the junction.

Because the nitride semiconductors have wider energy gaps than silicon or the III-V arsenides and phosphides, UV and blue LEDs and injection lasers are possible. In order to produce blue light emission, GaN must be alloyed with some In to reduce the energy gap. High brightness LEDs have been made using heterostructures comprising layers of GaN and the alloys, $Al_xGa_{1-x}N$ and $In_yGa_{1-y}N$, Nakamura et al, Appl. Phys. Lett., vol 64, no. 13, pp 1687–1689, (1994).

The wider energy gaps also mean that electronic amplifier and switching devices based on nitrides can remain operational at much higher temperatures. Furthermore, these nitride materials have higher thermal conductivities than Si, GaAs, or InP, and therefore can handle greater power levels. The nitride semiconductors can also withstand much higher levels of reverse bias voltages without breaking down. It has been shown that the III-V nitrides possess many of the most desirable properties for application to high temperature electronic devices K. Shenai et al, IEEE Trans. Electron. Dev., vol. 36, pp. 1811–1823 (1989). Simple GaN field-effect transistors using Schottky barrier gate contacts have been reported, M. Asif Khan et al, Appl. Phys. Lett. vol. 62, pp. 1786–1788 ( 1993). However, the maximum achievable gains and bandwidths will remain limited unless heterojunction transistors can be manifested. Much superior operating characteristics are generally expected from transistors featuring heterojunctions between a wider energy gap charge supply layer and a narrower energy gap undoped charge transit channel, a so-called "high electron mobility transistor" or HEMT (also called a modulation-doped-field-effect-transistor or MODFET). Such a HEMT using a GaN channel and an AlN—GaN alloy film as the charge supply film has now been demonstrated, M. Asif Khan et al, Appl. Phys. Lett., vol. 63, pp. 1214–1216 (1993). Furthermore, the gain of a bipolar transistor is improved if the emitter-base heterojunction is chosen so as to impede back injection of charges from the base into the emitter, a so-called "heterojunction bipolar transistor," or HBT.

The $In_xGa_{1-x}N$ alloys provide a wide range of choices of energy gaps, ranging from 1.9 eV (InN) to 3.4 eV (GaN). Unfortunately, in close analogy with the GaAs/InAs alloy series, InN has a significantly larger lattice parameter than GaN (a=3.548 Å vs. a=3.189 Å, respectively), and therefore such alloys grown on GaN must suffer from increased numbers of structural (and hence potentially electrically active) defects due to the mismatch. Such defects may be expected to impede high frequency and high power device applications. Another problem with GaN is that it is hard to make heavily doped p-type layers so that forming electrical contacts is difficult.

Given the problems with GaN based devices, it would be useful to have another compound which has a better lattice match to GaN and may possible have other useful properties. Preferably it should be a nitride for ease of MOCVD processing and because it would more likely grow epitaxially on GaN. While the binary III-V nitride compounds have been extensively investigated, no ternary compounds have. One could be formed by substituting elements on either side of Ga in the Periodic Table, namely Zn (Group II) and Ge (Group IV) to form $ZnGeN_2$. Another possibility is $ZnSiN_2$. In addition to their use with GaN based devices, these ternary nitrides should have uses on their own. Single crystal thin films of these compounds were not heretofore known but the phosphide, $ZnGeP_2$, is.

$ZnGeP_2$ is used extensively for frequency shifting applications due to its high birefringence and substantial nonlinear optical figure of merit, G. D. Boyd et al, Appl. Phys. Lett., vol. 18, pp. 301–303 (1971). MOCVD growth of $ZnGeP_2$ has been reported, G. C. Xing et al, Mat. Res. Soc. Symp. Proc., vol. 162, pp. 615–620 (1990). All MOCVD samples proved to be low resistivity p-type, with carrier concentrations around $1\times10^{18}$ $cm^{-3}$; whereas, samples prepared by sublimation and transport in a closed tube proved to be n-type. Thus, changes in the growth conditions can shift the conductivity type for $ZnGeP_2$ from p- to n-type; and clearly, the Zn/Ge ratio will be critical. A deficiency of Zn leads to vacancies on the cation lattice and hence the formation of acceptors (p-type). A stoichiometric Zn/Ge ratio with P vacancies will give donors (n-type). The extra degree of freedom presented by the ternary II-IV-$V_2$ compound can allow n- and p-type conductivity to be manifested without the need for extrinsic dopants. Although the result is not certain, by analogy, $ZnGeN_2$ and the other II-IV-$N_2$ materials may also provide both types of doping with control afforded through manipulation of the, for example, Zn/Ge ratio in the vapor.

An early report of $ZnGeN_2$ powders was given by M. Maunaye et al, Mat. Res. Bull., vol. 5, pp. 793–796 (1970), who prepared $ZnGeN_2$ by reacting zinc metal with $Ge_3N_4$ at 750° C. Their product was contaminated with excess Ge. This same group later reported that the structure was wurtzite (as is GaN) with lattice constants of a=b=3.167 and c=5.194 which are close to GaN, M. Wintenburger et al, Mat. Res. Bull., vol. 8, pp. 1049–1054 (1973).

Only one group has reported the preparation of $ZnGeN_2$ in thin film form. They reacted elemental zinc and germanium with gaseous hydrogen chloride (HCl) and allowed these zinc and germanium chlorides to react with ammonia gas in a tube furnace,. W. L. Larson et al, J. Electrochem. Soc., vol.121, pp. 1673–4 (1974). They used sapphire as a substrate, and produced poly-crystalline thin films with a pale yellow color. The energy gap was suggested to be 2.67 eV, based on optical transmission measurements.

Until recently, the existence of $ZnSiN_2$ was not known. However, T. Endo et al, J Mat. Sci. Lett., vol. 11, pp. 424–426 (1992), mixed $Zn_3N_2$ with either $Si_3N_4$ or $Ge_3N_4$ powders and heated them at 1000–1600° C. under an extremely high pressure of 4–6.5 GPa for several hours and report recovering both $ZnGeN_2$ and $ZnSiN_2$. Their samples of $ZnGeN_2$ were black and conducting, probably due to a lack of stoichiometry (nitrogen loss during the reaction). They also reported quaternary alloys of the form $ZnSi_{(1-x)}Ge_xN_2$, T. Endo et al, Ceram. Eng. Sci. Proc., vol. 13, pp. 844–851 (1992).

SUMMARY

What is disclosed is a thin film of the compound $ZnSi_xGe_{1-x}N_2$ (where x can range from 0 to 1) characterized by being a single crystal. This thin film single crystal can be disposed on a single crystal substrate made of, for example, sapphire, silicon carbide, lithium gallate, or silicon with or without an additional GaN buffer layer grown on them. Alternately, a GaN single crystal thin film grown on any substrate can be used. In the case of sapphire, it can be r-plane sapphire so that the thin film is further characterized by having a c-axis lying within the thin film or c-plane so that the thin film is further characterized by having a c-axis perpendicular to the substrate. The substrate could also be any substrate with a GaN single crystal thin film deposited on it.

Also disclosed is an MOCVD method of growing a thin film of the compound $ZnSi_xGe_{1-x}N_2$ (where x can range from 0 to 1) comprising the steps of providing a single crystal substrate, selecting precursors for Zn, Si, and/or Ge, selecting a source of gaseous nitrogen ions; and further comprising the steps of heating the substrate in a nitrogen atmosphere, adjusting the substrate temperature to a growth temperature for the single crystal film, introducing copious amounts of the gaseous nitrogen ions, thereafter, introducing the precursor gases for each of the selected elements Zn, Si and/or Ge with a high ratio of Zn to Si and/or Ge, and maintaining the conditions for a sufficient time to allow growth of the thin film single crystal. A possible additional step of, after heating the substrate in the nitrogen atmosphere, adjusting the substrate temperature for a growth temperature of a GaN buffer layer, introducing copious amounts of the gaseous nitrogen as ions, thereafter, introducing a precursor gas for Ga and maintaining the GaN growth temperature for sufficient time to grow a very thin (ca. 20 nm) buffer layer is disclosed.

Suitable precursor gas flow molar rates were found to include but not be limited to a ratio for Zn to Ge in the range of 6.7:1 to 11.7 when X=0 and a molar ratio of Zn to Si in the range of 10.7 to 11.7 when X=1. The of molar ratio of Si to Ge should be adjustable to produce a desired value of X.

The thin film single crystal growth temperature is at least 550° C., preferably at least 650° C. for X=0 and at least about 700° C. for X=1 and between at least 550° C. and 700° C. for X between 0 and 1 but higher temperatures are not excluded. The MOCVD pressure is in the range of 1 to 304 torr but higher pressures are not excluded.

Also disclosed are optical, electro-optical or electronic devices comprising a single crystal thin film of the compound $ZnSi_xGe_{1-x}N2$ (where x can range from 0 to 1). In particular, an optical device comprising a single crystal sapphire substrate having a (112) orientation on which is disposed a $ZnSi_xGe_{1-x}N2$ (where x can range from 0 to 1) single crystal thin film having a (110) orientation, whereby supra- and sub-harmonics are generated if laser light is perpendicularly incident on the thin film.

DETAILED DESCRIPTION $ZnGeN_2$ and $ZnSiN_2$ single crystal thin films were grown using the MOCVD method. While this technique is old and well known, for growth of $ZnGeN_2$, two different reaction chambers were used and these will be described briefly.

Figure 1:
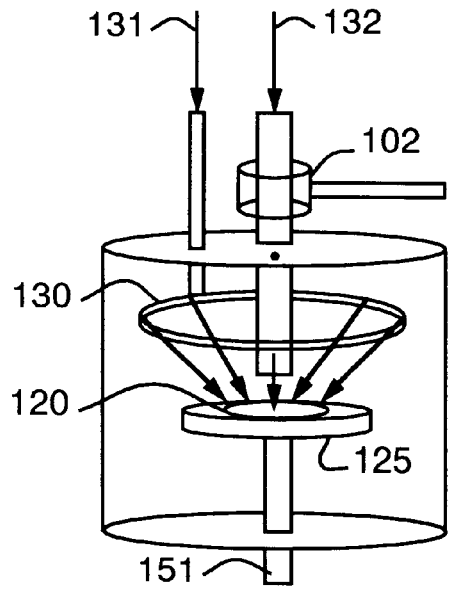
FIG. 1 illustrates an MOCVD reaction chamber utilizing a plasma.

The first chamber, illustrated in FIG. 1, supplied nitrogen ions by creating an ionized plasma in the microwave cavity 102 in the incoming quartz nitrogen line 132 using a microwave generator (not shown). The power injected into the microwave cavity was 70 watts. Ionization of the nitrogen gas was aided by including with it about 5% by volume of ultrahigh purity argon. The partially ionized nitrogen was directed through the quartz line, which was about 1.27 cm in diameter, down to within 4.5 cm of the substrate 120. It should be noted that 15% by volume of hydrogen was mixed with the nitrogen. It is believed this is useful in scavenge any carbon by-products from the organo metallic compounds. Precursors were mixed in an external chamber (not shown) and brought in through the stainless steel line 131. They then were directed through a tubular 5 cm diameter ring 130, which had 0.5 mm holes drilled on a 1 cm spacing at an angle 30° from the vertical and facing the substrate. Since the substrate was not rotated, this approach was taken to promote uniformity. This chamber was limited to a maximum substrate temperature of about 660° C.

Figure 2:
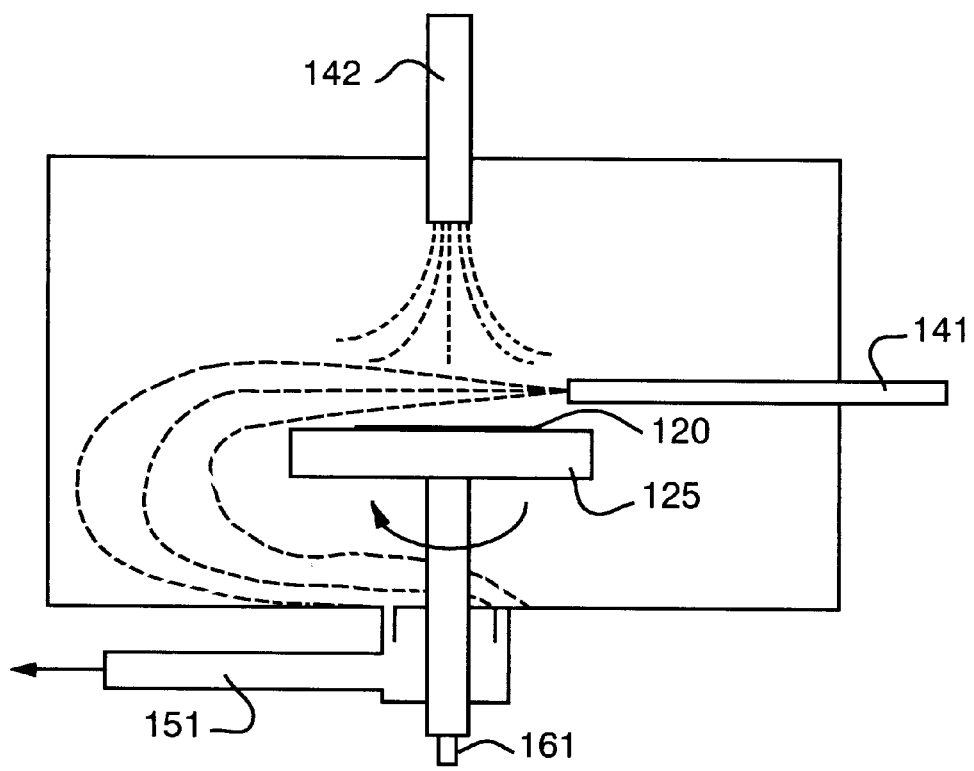
FIG. 2 illustrates an MOCVD reaction chamber utilizing a rotating substrate holder.

The second chamber, illustrated in FIG. 2, did not have a microwave cavity and the substrate was rotated. In this case ammonia ($NH_3$) was used as a source of nitrogen and hydrogen ions. The ammonia and metal organic precursors were injected from the side through separate stainless steel tubes 141 ending just short of the substrate 120. Since the substrate is at least 500° during film growth, the ambient immediately above it is hot enough to cause the precursors to become buoyant and not reach the substrate. One well known method to overcome this is to use a gas directed at the substrate from the top inlet 142 to push the precursor gases back to the substrate. It is very convenient when growing nitrides to use nitrogen gas even though little of it would react. In this chamber, the substrate support 125 and the substrate 120 were rotated at 100 to 800 rpm by turning the rod 161.

In both chambers, the substrate was supported by a circular plate of graphite 125, slightly larger than 2.5 cm, coated with pyrolytically deposited silicon carbide to protect the graphite. The heater was a similarly coated graphite resistance type located about 6 mm below the support. The substrate temperature was measured indirectly with an optical pyrometer using a silicon detector and having an optical passband of 0.8–1.1 um. Since sapphire is transparent to 6 um, the temperature of the sapphire surface is always less than the indicated temperature which is that of the underlaying graphite support. The difference may be as much as 100° C. Therefore, in duplicating the disclosed results herein, one should use the same pyrometer range or experiment with lesser temperatures. Such experimentation is considered routine in the art of MOCVD.

Also, as is standard practice, both chambers were under constant evacuation through tubes 151 and the pressure was regulated with a throttle valve (not shown) on the evacuation line. A plasma cannot be easily maintained at high pressures and that chamber was regulated to 1.1+/−0.1 torr, but higher pressures could be used in the other chamber.

Selection of precursor chemicals is usually based on ease of use. The injection rate is controlled by heating or cooling the precursor chemical and therefore, a major selection criteria is its vapor pressure. For the Zn source, diethylzinc (DEZ) and dimethylzinc (DMZ) are commercially available. DEZ is convenient because at 10° C. it has a vapor pressure of 6.8 mm of Hg, which is adequate, while DMZ already has a high vapor pressure at −15° C. Similarly, when Ga sources were needed, triethylgallium (TEG) was more convenient than trimethylgallium (TMG). For both DEZ and TEG, a nitrogen carrier gas was used. For Ge, the only metal organic, trimethylgermanium, has a very high vapor pressure and the hydride, germane ($GeH_4$), was chosen. Germane is highly toxic but can be handled safely if diluted to 0.1% in helium which was done. As an Si source, disilane ($Si_2H_6$) was used.

All examples used c- or r-plane 2.5 cm diameter sapphire substrates. These were degreased in a solution of acetone followed by methanol and then deionized water. Then they were etched in a 3:1 solution of $H_2SO_4$ and $H_3PO_4$ for 30 minutes at about 170° C. and thoroughly rinsed in deionized water followed by drying in nitrogen gas. Next, they were placed in the sample holder in the reaction chamber which was subsequently purged with ultrahigh purity nitrogen gas. The next step depended on which reaction chamber was used as will be described in the embodiments.

An X-ray diffractometer was used to measure diffraction peaks for all films. Since the primary purpose was to determine if the films were single crystal and, if so, their orientation, these curves are not presented, only the location of the peaks. Note that sapphire always produced the expected strong diffraction peak at 52.548° for the r-plane, $\bar{1}$ orientation and 41.683° for the c-plane (006) orientation and this is not mentioned further. An EDX apparatus was used to measure atomic percentage ratios for some of the films. Since no bulk samples of these materials is available, calibration was difficult and may only be good to about 1–2%. Other measurements are noted in the examples.

$ZnGeN_2$ growth in the plasma chamber:

EXAMPLE #1

C-plane sapphire was used. The nitrogen plasma was turned on and the substrate temperature was maintained at 650° C. for 50 min. It is believed that this nitriding step results in a monolayer or so of aluminum nitride (AlN) on the sapphire surface, but this was not confirmed. The monolayer may promote starting the growth of nitride films. After this attempt at nitriding, the temperature was set to 550° C. DEZ was injected at a rate of 30.4 $\mu$mol/min and germane at a rate of 2.6 $\mu$mol/min. After 2 hours, the nitrogen plasma was turned off and the substrate cooled in a nitrogen atmosphere. The film was yellow. Diffraction peaks occurred at 34.4°, 36.9°, and 57.95° indicating a polycrystal. Even though this is not a preferred embodiment, it allowed calculation of the unit cell parameters of a=b=3.1826 Å and c=5.2132 Å in close agreement with Wintenburger et al. The EDX gave 48:52 as the Zn:Ge ratio.

EXAMPLE #2

In this example a previously grown c-plane sapphire substrate with an approximately 0.5 $\mu$m GaN thin film was used. The substrate was nitrided at 660° C. for 30 min followed by a further 10 min. at 550° C. Otherwise it was the same as Example #1 except the germane rate was reduced from 3.1 to 2.6 $\mu$mol/min and the growth time increased to 5 hours. This produced a yellowish film with a single diffraction peak at 34.6° indicating a single crystal with a (002) orientation. EDX gave a ratio of 49.9:50.1 for Zn:Ge. This accuracy is better than the EDX is capable of but indicates the ratio is close to 50:50.

EXAMPLE #3

This example was like the last example except the nitriding was extended to 40 min. at 660° C. and 30 min. at 550° C. Also, the growth temperature was extended to 8½ hours. The film was yellowish and had the expected diffraction peak at 34.6°.

EXAMPLE #4

This is the last example in the plasma reactor. A bare c-plane sapphire substrate was used. The nitriding consisted of only 60 min. at 660° C. The growth temperature was raised to 650° C. After which, DEZ was injected at a rate of 30.4 umol/min and germane at the rate of 2.6 $\mu$mol/min for a growth time of 5 hours. This produced a yellowish film with a single diffraction peak at about 34.6°.

The optical transmission of this sample was measured with a spectrophotometer from 0.2 to 0.9 um. The asymptote of the curve crossed zero transmission at 380 nm indicating an energy gap of 3.2 eV which is 0.2 eV smaller than GaN's allowing heterojunctions to be formed with it.

Figure 3:
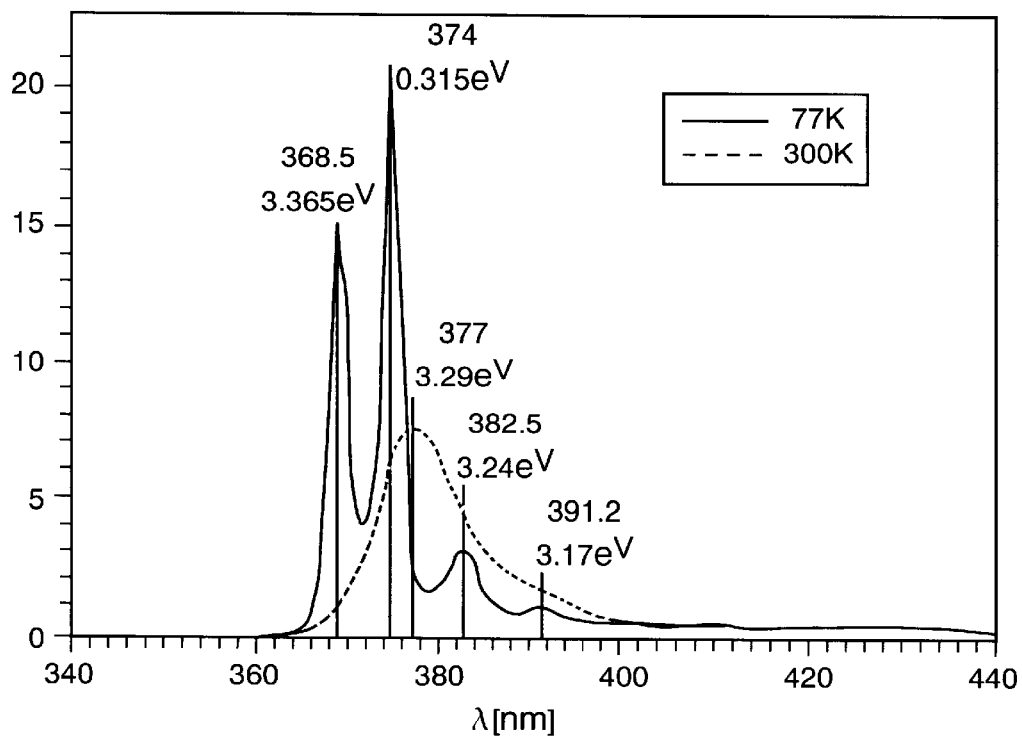
FIG. 3 illustrates a photoluminescence curve of a $ZnGeN_2$ thin film single crystal.

As a further experiment, a photoluminescence measurement was undertaken on this sample. A 325 nm HeCd laser was used to illuminate the sample at room temperature and 77° K. As illustrated in FIG. 3, at the lower temperature five distinct peaks appeared at 368.5 nm (3.365 eV), 374 nm (3.315 eV), 377 nm (3.29 eV), 382.5 nm (3.24 eV) and 391.2 nm (3.17 eV). It is difficult with a new material to determine the mechanism for each of these peaks. However, their existence confirms that the film has reasonable optical quality. $ZnGeN_2$ growth in the rotating sample holder chamber:

Instead of using a microwave cavity to ionize nitrogen, ultrahigh purity ammonia was used as the nitrogen and hydrogen ion source. In all cases, in addition to the nitriding step, a step was introduced of growing GaN buffer layer of about 20 to 50 nm.

EXAMPLE #5

R-plane sapphire was used for the first time. The substrate rotation rate was 400 rpm. The substrate was raised to 925° C. and held for 10 min. in a pure nitrogen atmosphere, then 2 l/min. of ammonia was injected into the chamber for 5 min. After this, the substrate temperature was lowered to 606° C. and TEG was injected at a rate of 4.5 umol/min for only 5 min while maintaining the ammonia rate. After this buffer layer growth step, the substrate temperature was raised to 658° C. and DEZ was injected at a rate of 40 umol/min, germane at 4 µmol/min and ammonia at 3 l/min. The growth time was 2 hours. Unlike the plasma system, the ambient could be maintained at much higher pressures. In this example, 104 torr was used throughout the process. The film was nearly colorless and had a single diffraction peak at 58.1° indicating a (110) orientation parallel to the $\bar{1}$ orientation of the r-plane substrate.

This sample was irradiated with Nd:Yag laser at 1064 nm and produced second harmonic generated blue-green emission at 532 nm. This is to be expected since this crystal is of the mm2 orthorhombic class. As such it possesses a unique anisotropic crystalline axis, the c-axis, which results in a second-order non-linear susceptibility, even in the absence of an electric field. For the $ZnGeN_2$ version, when it is deposited on a r-plane sapphire having a $\bar{1}$ orientation, the film spontaneously adopts the (110) orientation which places the unique axis (c-axis) within the plane of the grown film. Thus, when the laser was incident perpendicular to the surface with a polarization which places its electric field vector parallel to the c-axis of the material in the film, then the harmonic was generated. However, when the polarization of the laser was transverse to the c-axis of the film, no second harmonic was generated.

EXAMPLE #6

In this example, both r and c-plane sapphire half circles were used. The rotation speed was 100 rpm. The substrate was raised to 95° C. and held for 25 min. in a pure nitrogen atmosphere then 2 l/min. of ammonia was injected into the chamber for 5 min. After this, the substrate temperature was lowered to 61° C. and TEG was injected at a rate of 4.1 µmol/min for only 5 min while maintaining the ammonia rate. After this buffer layer growth step, the substrate temperature was raised to 658° C. and DEZ was injected at the rate of 40 µmol/min, germane at 4 µmol/min and ammonia at 4 l/min. The growth time was 1 hour and 20 min. Ambient pressure was maintained at 304 torr throughout the process. The film on the r-plane sapphire was nearly colorless and had a diffraction peak at 58.1° while the c-plane film was more yellowish and had the usual 34.6° peak.

EXAMPLE #7

This example was substantially identical to the last example, except the substrate rotation speed was 800 rpm. This produced a single crystal film on the r-plane wafer but a polycrystalline film on the c-plane wafer. It is possible that there were unknown contaminants. Another explanation is that since two half discs were used, at this high rotation speed, the halves were not in good thermal contact with the substrate holder and thus too cold for the c-plane sapphire. It is clear that too low a temperature produces polycrystals, but this also may indicate that r-plane sapphire is an easier one to grow on.

Hall effect measurements yielded interesting results. Both were n-type and the c-plane film showed a carrier concentration of $5 \times 10^{19}$/cc with a mobility of 12 $cm^2$/V-s while the r-plane film showed a carrier concentration of $5 \times 10^{20}$/cc with a mobility of 5 $cm^2$/V-s. These mobilities ar rather low but the high carrier concentration in the r-plane sample may be very useful for forming contacts to other semiconductors. For example, it is very difficult to make heavily doped p-type GaN.

$ZnSiN_2$ Growth: All $ZnSiN_2$ growth was performed in the rotating sample holder chamber.

EXAMPLE #8

C-plane sapphire was used. The rotation speed was 100 rpm. The substrate was raised to 980° C. for 7 min. in a nitrogen atmosphere and then the temperature was lowered to 965° C. and ammonia injected at the rate of 2 l/m for 5 min. The substrate temperature was then lowered to 603° C. and TEG injected at the rate of 5.3 µmol/min for 5 min. After this buffer layer step, the temperature was raised to 682° C., DEZ was injected at the rate of 30.4 µmol/min, disilane at 3.1 µmol/min and ammonia at 4 l/min. Pressure was maintained at 304 torr. Growth time was 2 hours. This resulted in a poly-crystalline film.

EXAMPLE #9

R-plane sapphire was used. The rotation speed was 150 rpm. The substrate was raised to 1000° C. for 5 min. in a nitrogen atmosphere and then the temperature was lowered to 973° C. and ammonia injected at the rate of 2 l/m for 5 min. The substrate temperature was then lowered to 592° C. and TEG injected at the rate of 5.3 umol/min for 5 min. After this buffer layer step, the temperature was raised to 699° C., DEZ was injected at the rate of 30.4 µmol/min, disilane at 2.8 µmol/min and ammonia at 4 l/min. Pressure was maintained at 150 torr. Growth time was 2½ hours. This resulted in a clear transparent film with a diffraction peak at 59.78°. The atomic ratios of Zn:Si:N were 27:25:47. The film was 0.75 µm thick.

EXAMPLE #10

C-plane sapphire was used. The rotation speed was 150 rpm. The substrate was raised to 960° C. for 10 min. in a nitrogen atmosphere and then the temperature was lowered to 933° C. and ammonia injected at the rate of 2 l/m for 5 min. The substrate temperature was then lowered to 605° C. and TEG injected at the rate of 5.3 μmol/min. for 5 min. After this buffer layer step, the temperature was raised to 699° C., DEZ was injected at the rate of 30.4 μmol/min, disilane at 2.6 μmol/min and ammonia at 4 l/min. Pressure was maintained at 150 torr. Growth time was 4 hours. This resulted in a clear transparent film with a diffraction peak at 35.56°. The film was 1.2 μm thick.

The MOCVD method has been used to grow GaN based compounds for almost thirty years. Much has been learned in the way of optimization for those nitrides. Nonetheless, single crystal thin films of the ternary nitrides $ZnGeN_2$ and $ZnSiN_2$ can be grown under the proper conditions. Ambient pressure does not seem to be critical. As is well known form GaN work, ammonia does not dissociate easily and a copious supply must be used but there is no need to be overly concerned about too much. Zn is highly volatile at these substrate temperatures and so the ratio of Zn to Ge or Si must be high. It appears that ratios of Zn:Ge precursor ranging from 6.7 to 11.7 and Zn:Si ratios of 10.8 and 11.7 produce single crystals. Routine experimentation should yield other ratios which could work or even produce crystals with altered characteristics.

Two very different reactor designs were used. The rotating sample holder reactor produced qualitatively sharper diffraction peaks, indicating better uniformity over the substrate. Nonetheless, the basic process does not seem to be reactor dependent. The substrate temperature must be low enough so that the precursors are adsorbed long enough to react but high enough so that a good quality crystal is formed. Low temperatures produce polycrystals or, in examples not illustrated, amorphous films. Thus, using the ratios disclosed herein, a few runs of increasing temperature would soon produce single crystal films. Thicker ones can be produced by using proportionately increased portions or extending the length of the run. For $ZnGeN_2$, growth at 700° C. produced a very thin film, most likely because the Zn did not react with the Ge fast enough. For $ZnSiN_2$, higher temperatures may be possible. A wide range of pressures were used from 1 torr to almost half an atmosphere with similar results.

It should be possible to use other substrates. SiC and lithium gallate are even better lattice matches than sapphire. Silicon's lattice is much larger than these nitrides but it is known how to grow GaN on it. Therefore a GaN buffer layer could always be used for these nitrides. In fact, a buffer layer of these materials could also be used on any substrate where required. GaN was only used because the process was well known.

Lastly, by analogy with the GaN based nitrides where alloys of (Al,Ga,In)N are routinely produced, since Endo has shown they exist, the $ZnGe_xSi_{1-x}N_2$ should also be easy to grow by adding another injection tube and adjusting the rates of Ge and Si precursors to achieve the desired value of x.

Figure 4:
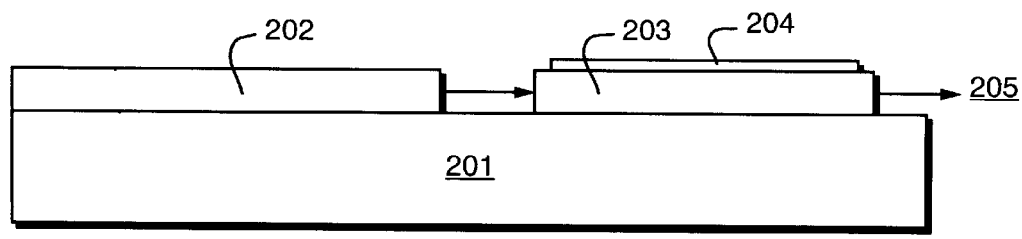
FIG. 4 illustrates a $ZnGeN_2$ single crystal thin film used as a second harmonic generator.

As an example of a device that can readily be made with these nitrides, a relatively simple structure which can produce harmonic generation is illustrated in FIG. 4. A diode laser 201, which could be made from the invented material or another material, is deposited on the structural substrate 202. A layer of the these single crystal nitrides 203 is deposited adjacent (though not necessarily in close proximity) followed by a cladding layer 204. If the diode laser illuminates the nitride layer at a wavelength less than twice the absorption edge, then light 205 at the second harmonic frequency (half the pumping wavelength) will be generated. For example, blue light at 450 nm could be generated with a 900 nm GaAs laser.

On the other hand, if element 202 consists of two adjacent diode lasers which are slightly off-set in their emission wavelengths and which are both focussed into the nitride layer 203, then the difference in their frequencies, which will may be an infrared frequency, can be generated. Thus the invented material can generate super- and sub-harmonics. End mirrors or a grating etched in film 204 will determine which wavelength is selected. However, it is critical in such cases to provide phase matching, so that the phase velocities of the pump and the harmonic remain synchronized. In this material grown on r-plane sapphire with the unique c-axis within the plane of the film, one may rotate the film about an axis perpendicular to the surface until, due to birefringence, the two phase velocities are equal. Such phase matching cannot be accomplished in ordinary non-linear optical films which tend to grow with the c-axis perpendicular to the surface. In that case, all directions within the film are equivalent which means that phase matching cannot be accomplished.

What is claimed is:

1. A semiconductor article comprising:
   a) a substrate; and
   b) at least one substantially single crystal layer deposited on said substrate and consisting essentially of a compound with a chemical formula $ZnSi_xGe_{1-x}N_2$ wherein $0 \leq x \leq 1$.

2. The article of claim 1 wherein x is essentially 0.

3. The article of claim 1 wherein x is essentially 1.

4. The article of claim 1 further comprising a buffer layer disposed between said substrate and said substantially single crystal layer.

5. The article of claim 4 wherein x is essentially 0.

6. The article of claim 4 wherein x is essentially 1.

7. The article of claim 1 wherein said substrate is r-plane sapphire and further comprising a buffer layer disposed between said substrate and said substantially single crystal layer.

8. The article of claim 7 wherein x is essentially 0.

9. The article of claim 7 wherein x is essentially 1.

10. The article of claim 7 wherein said buffer layer is essentially GaN.

11. The article of claim 10 wherein x is essentially 0.

12. The article of claim 10 wherein x is essentially 1.

13. The article of claim 1 wherein said substrate is c-plane sapphire and further comprising a buffer layer disposed between said substrate and said substantially single crystal layer.

14. The article of claim 13 wherein x is essentially 0.

15. The article of claim 13 wherein x is essentially 1.

16. The article of claim 13 wherein said buffer layer is essentially GaN.

17. The article of claim 16 wherein x is essentially 0.

18. The article of claim 16 wherein x is essentially 1.

19. The article of claim 1 wherein said substrate is silicon carbide and further comprising a buffer layer disposed between said substrate and said substantially single crystal layer.

20. The article of claim 19 wherein x is essentially 0.

21. The article of claim 19 wherein x is essentially 1.

22. A semiconductor article comprising:
    a substrate; and
    a thin film single crystal layer deposited on said substrate and consisting essentially of a compound with a chemical formula $ZnSi_xGe_{1-x}N_2$ wherein $0 \leq x \leq 1$.

23. The article of claim 22 wherein x is essentially 0.

24. The article of claim 22 wherein x is essentially 1.

25. The article of claim 22 further comprising a buffer layer disposed between said substrate and said single crystal layer.

26. The article of claim 25 wherein x is essentially 0.

27. The article of claim 25 wherein x is essentially 1.

28. The article of claim 22 wherein said substrate is r-plane sapphire and further comprising a buffer layer disposed between said substrate and said single crystal layer.

29. The article of claim 28 wherein x is essentially 0.

30. The article of claim 28 wherein x is essentially 1.

31. The article of claim 28 wherein said buffer layer is essentially GaN.

32. The article of claim 31 wherein x is essentially 0.

33. The article of claim 31 wherein x is essentially 1.

34. The article of claim 22 wherein said substrate is c-plane sapphire and further comprising a buffer layer disposed between said substrate and said single crystal layer.

35. The article of claim 34 wherein x is essentially 0.

36. The article of claim 34 wherein x is essentially 1.

37. The article of claim 34 wherein said buffer layer is essentially GaN.

38. The article of claim 37 wherein x is essentially 0.

39. The article of claim 37 wherein x is essentially 1.

40. The article of claim 22 wherein said substrate is silicon carbide and further comprising a buffer layer disposed between said substrate and said single crystal layer.

41. The article of claim 40 wherein x is essentially 0.

42. The article of claim 40 wherein x is essentially 1.

43. The article of claim 22 comprising an optical device.

44. The article of claim 22 wherein the thin film emits a harmonic of light incident on the thin film.

* * * * *